(12) United States Patent
Bae et al.

(10) Patent No.: US 7,688,102 B2
(45) Date of Patent: Mar. 30, 2010

(54) MAJORITY VOTER CIRCUITS AND SEMICONDUCTOR DEVICES INCLUDING THE SAME

(75) Inventors: Seung-Jun Bae, Daejeon (KR);
Jeong-Don Lim, Seongnam-si (KR);
Gil-Shin Moon, Hwaseong-si (KR);
Kwang-Il Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/819,600

(22) Filed: Jun. 28, 2007

(65) Prior Publication Data
US 2008/0001626 A1     Jan. 3, 2008

(30) Foreign Application Priority Data
Jun. 29, 2006  (KR) ............... 10-2006-0059684
Dec. 20, 2006  (KR) ............... 10-2006-0131054

(51) Int. Cl.
*H03K 19/003* (2006.01)
(52) U.S. Cl. ............... 326/11; 326/35; 326/36; 714/760
(58) Field of Classification Search ........ 326/9–11, 326/35–36, 104; 327/215; 341/50–51, 55; 714/760, 797
See application file for complete search history.

(56) References Cited

U.S. PATENT DOCUMENTS

| 5,917,364 | A   | * | 6/1999 | Nakamura ............. 327/415 |
| 6,549,476 | B2  |   | 4/2003 | Pinney |
| 6,798,367 | B2  | * | 9/2004 | Nakagawa et al. ......... 341/144 |
| 7,183,795 | B2  | * | 2/2007 | Ye et al. ............. 326/36 |
| 7,406,608 | B2  | * | 7/2008 | Joshi ............. 713/300 |
| 2004/0068594 | A1 |   | 4/2004 | Asaro et al. |
| 2005/0188282 | A1 |   | 8/2005 | Joshi |
| 2005/0216630 | A1 |   | 9/2005 | Gaskins et al. |

FOREIGN PATENT DOCUMENTS

| JP | 03-046196 | 2/1991 |
| JP | 2005-044456 | 2/2005 |

(Continued)

OTHER PUBLICATIONS

A Korean Notice of Allowability (dated May 30, 2007) for counterpart Korean Patent Application No. 10-2006-0059684 is provided for the purpose of certification under 37 C.F.R. § 1.97(e).

(Continued)

*Primary Examiner*—Vibol Tan
*Assistant Examiner*—Christopher Lo
(74) *Attorney, Agent, or Firm*—Harness, Dickey & Pierce, P.L.C.

(57) ABSTRACT

A majority voter circuit is configured to generate a selecting signal based on first input data and inverted first input data. The first input data and the inverted first input data each include an odd-number of bits, and the odd-number of bits include bits of a first type and bits of a second type. The generated selecting signal is indicative of which of the first type and the second type of bits in the first input data are in the majority.

23 Claims, 5 Drawing Sheets

FOREIGN PATENT DOCUMENTS

| | | |
|---|---|---|
| JP | 2005-196871 | 7/2005 |
| JP | 2005-209304 | 8/2005 |
| KR | 100259092 B1 | 3/2000 |
| KR | 10-2004-0012677 | 2/2004 |
| KR | 10-0735758 B1 | 6/2007 |

OTHER PUBLICATIONS

Decision of Grant dated Mar. 24, 2008, for corresponding Korean Patent Application No. 10-2006-0131054, from the Korean Patent Office (1 p.).

* cited by examiner

MAJORITY VOTER CIRCUITS AND SEMICONDUCTOR DEVICES INCLUDING THE SAME

PRIORITY STATEMENT

This non-provisional U.S. patent application claims priority under 35 U.S.C. § 119 to Korean Patent Application No. 2006-0059684, filed Jun. 29, 2006 and Korean Patent Application No. 2006-0131054, filed Dec. 20, 2006, the entire contents of each of which are incorporated herein by reference.

BACKGROUND

As conventional semiconductor devices become faster, impedance matching may be more difficult. For example, when a conventional semiconductor device outputs/receives data to/from an external device at a relatively high speed, a reflected wave may be generated. The reflected wave may result from mismatched impedance between signal lines and/or a signal line and an output driver. The reflected wave may cause distortion of transmitted data, leading to errors. Matching impedance may suppress and/or prevent generation of the reflected wave when transmitting data.

To suppress the mismatched impedance, a conventional semiconductor device may have an off chip driver (OCD) and an on die termination circuit (ODT). The OCD may output a signal to the external portion. The on die termination circuit (ODT) may suppress and/or prevent reflection of a signal transmitted from the external circuit. In this example, the impedance characteristics of the OCD or ODT may be calibrated to secure signal integrity. As conventional semiconductor devices operate at higher speeds, the need for calibration of the impedance characteristics increases.

The OCD and/or ODT, however, may operate many switches simultaneously, which may generate noise during the calibration procedure. The amount of total electric current consumed by the OCD may change according to a value of data output from the conventional semiconductor device. Such a change in the amount of electric current may generate an induced electromotive force due to a parasitic inductance in a power line for supplying power to the OCD. The induced electromotive force may also be generated in the ODT, and may cause noise, reduce a voltage and/or time margin of a signal to restrict operating speed of the semiconductor device.

Conventionally, the OCD and ODT may use a differential signal in which a constant current is consumed. To use a differential signal, however, the number of terminals required for transmitting data is twice that of when a single signal is used. For example, when data output from the semiconductor device is 8-bit data, if a single signal is used, 8 output terminals are needed, whereas if a differential signal is used, 16 output terminals are needed.

Conventionally, to suppress degradation of system performance due to noise, a semiconductor device performs low weight coding using a data bus inversion circuit. When data are subjected to the low weight coding, the amount of the electric current flowing through data I/O line of the semiconductor device is reduced, such that bandwidth of data I/O line may be improved and/or data skew may be reduced.

Conventionally, a majority voter circuit may be used to perform low weight coding. A conventional majority voter circuit compares the number of bits having a value of "0" and the number of bits having a value of "1" in the data to determine which type of bit is a majority.

FIG. 1 is a block diagram illustrating a conventional data bus inversion circuit.

Referring to FIG. 1, a data generating portion (not shown) of a system including a semiconductor device may output data Data and inverted data /Data. A majority voter circuit 10 may receive the data Data and the inverted data /Data and determine which bit is in a majority from the data Data based on the number of bits having a value of "0" and the number of bits having a value of "1". The majority voter circuit 10 may generate and output a selecting signal sign based on which type of bit is in the majority.

For example, when the data Data is 8-bit data, the majority voter circuit 10 may compare the number of "0"s and the number of "1"s within the 8-bit data Data. If the number of "0"s is greater than 4 the majority voter circuit 10 outputs a selecting signal sign having an "L" level. Alternatively, if the number of "0"s is less than 4, the majority voter circuit 10 outputs a selecting signal sign having an "H" level.

An encoder 20 may select either of the data Data or the inverted data /Data in response to the selecting signal sign applied from the majority voter circuit 10 to output low weight coding (LWC) data.

Assuming data having "0" as a majority bit-type is easier for the system to increase a bandwidth and 8-bit data are applied, when the number of bits having a value of "0" is more than the number of bits having a value of "1" (e.g., Data of "00100100"), the majority voter circuit 10 may output the selecting signal sign having an "L" level such that the data Data may be output from the encoder 20. On the other hand, when the number of bits having a value of "1" is greater than the number of bits having a value of "0" (e.g., Data of "11100110"), the majority voter circuit 10 may output the selecting signal sign having an "H" level such that the inverted data /Data obtained by inverting the data Data may be output from the encoder 20 to make the number of bits having a value of "0" more than the number of bits having a value of "1" like "00011001".

FIG. 2 is a circuit diagram illustrating a conventional majority voter circuit. The majority voter circuit of FIG. 2 is an analog majority voter circuit and differential amplifier.

Referring to FIG. 2, an NMOS transistor N1 activates the majority voter circuit in response to an enable signal En. The enable signal En may be applied while the system receives the data Data and the inverted data /Data, or alternatively, the enable signal En may be applied invariably. A plurality of NMOS transistors NL0 to NL7 and NR0 to NR7 constitute an input portion of the majority voter circuit. The NMOS transistors NL0 to NL7 may receive corresponding bits D0 to D7 of the data Data, and the NMOS transistors NR0 to NR7 may receive corresponding bits /D0 to /D7 of the inverted data /Data. The NMOS transistors NL0 to NL7 and the NMOS transistors NR0 to NR7 may generate a voltage difference between a first node Node1 and a second node Node2 in response to the input data Data and the inverted data /Data.

Two PMOS transistors P1 and P2 may function as an amplifying circuit. The amplifying circuit may detect and amplify the voltage difference between the first and second nodes Node1 and Node2. The selecting signal sign may be output as a voltage level of the second node Node2.

For example, the conventional majority voter circuit of FIG. 2 detects and amplifies the voltage difference between the data Data and the inverted data /Data input via the NMOS transistors NL0 to NL7 and NR0 to NR7, respectively, to output the selecting signal sign. However, when the number of bits having a value of "0" is equal to the number of bits having a value of "1", a voltage difference between the ends of the differential amplifier may not exist, and thus, determining a majority may be impossible.

To compensate for such errors, two dummy transistors DNL and DNR may be employed in the majority voter circuit of FIG. 2. A weight applied using the dummy transistors DNL and DNR may be, for example, 0.5 or 1. When a weight is applied using the dummy transistors DNL and DNR, a ratio difference between the ends of the input portion is about 5.88% ($^{0.5}/_{8.5}$) when a weight of 0.5 is applied, and about 11.1% (⅑) when a weight of 1 is applied. The greater the difference between the ends of the input portion, the more stably the system may operate. Even though a weight is applied using the dummy transistors DNL and DNR, however, errors in determining a majority of data due to, for example, data distortion caused by noise, mismatched impedance with the external device, a difference in threshold voltage or a difference in size of the transistor may still occur.

SUMMARY

Example embodiments relate to majority voter circuits, for example, a majority voter circuit and a semiconductor device for reducing a malfunction which may occur when the number of bits having a high level is the same as the number of bits having a low level in data.

According to at least one example embodiment, a majority voter circuit may include an input circuit and an amplifying circuit. The input circuit may be connected between each of a first node, a second node and a common node. The input circuit may be configured to receive first input data including an odd number of bits and inverted first input data including an odd number of bits. The majority voter circuit may exclude a first number of bits from the first input data and the inverted first input data to generate a voltage difference between the first node and the second node. The amplifying circuit may be connected to a first power source and between the first node and the second node. The amplifying circuit may be configured to detect and amplify the voltage difference between the first node and the second node. The majority voter circuit may determine a majority by comparing the number of bits having a value of "0" and the number of bits having a value of "1" to output a selecting signal.

According to at least some example embodiments, the input circuit may exclude the same bit from the first input data and the inverted first input data. The input circuit may include a data input circuit having a plurality of first NMOS transistors, each of which may have a drain connected to the second node, a source connected to the common node and a gate for receiving the first input data. The input circuit may further include an inverted data input circuit including a plurality of second NMOS transistors each of which may have a drain connected to the second node, a source connected to the common node and a gate receiving the inverted first input data.

According to at least some example embodiments, the amplifying circuit may include a first PMOS transistor having a drain and a gate connected to the first node and a source connected to the first power supply voltage. The amplifying circuit may further include a second PMOS transistor having a drain connected to the second node, a gate connected to the first node and a source connected to the first power supply voltage.

According to at least some example embodiments, the majority voter circuit may further include an NMOS transistor connected between the common node and a second power supply voltage. The NMOS transistor may be configured to activate the majority voter circuit in response to an externally applied enable signal.

According to another example embodiment, a majority voter circuit may include an input circuit connected between a first node and a common node. The input circuit may be configured to receive an input weight and the first input data. The input circuit may also be connected between a second node and the common node, and be configured to receive an inverted input weight having an opposite phase to the input weight and the inverted first input data obtained by inverting the first input data. The input circuit may generate a voltage difference between the first node and the second node. The majority voter circuit may further include an amplifying circuit connected between a first power supply voltage and the first node. The amplifying circuit may be configured to receive an amplification weight, the first input data, an inverted amplification weight and the inverted first input data. The inverted amplification weight may have an opposite phase to the amplification weight. The amplifying weight may amplify the voltage difference between the first node and the second node.

According to at least some example embodiments, the amplifying circuit may include a switch circuit connected between the first node and a plurality of third nodes. The switch circuit may be configured to receive the amplification weight and the first input data. The switch circuit may also be connected between the second node and a plurality of fourth nodes, and may receive the inverted amplification weight and the inverted first input data. The amplifying circuit may further include a data amplifying circuit connected between the first power supply voltage and the plurality of third nodes to amplify a voltage of the first node to the second node in proportion to the amplification weight and the number of bits of a first-type in the first input data. The data amplifying circuit may also be connected between the first power supply voltage and the plurality of fourth nodes to amplify a voltage of the second node to the first node in proportion to the inverted amplification weight and the number of bits of the inverted first input data of a first bit-type.

According to at leas some example embodiments, the switch circuit may include a first switch circuit having a plurality of first switch transistors and a first switch dummy transistor connected in parallel between the first node and the plurality of third nodes. Gates of the plurality of first switch transistors may receive respective bits of the first input data, and a gate of the first switch dummy transistor may receive the amplification weight. A second switch circuit may include a plurality of second switch transistors and a second switch dummy transistor connected in parallel between the second node and the plurality of fourth nodes. Gates of the plurality of second switch transistors may receive respective bits of the inverted first input data. A gate of the second switch dummy transistor may receive the inverted amplification weight.

According to at least some example embodiments, the data amplifying circuit may include a first data amplifying circuit and a second data amplifying circuit. The first data amplifying circuit may include a plurality of first amplifying transistors and a first amplifying dummy transistor connected in parallel between the first power supply voltage and the plurality of third nodes. Gates of the plurality of first amplifying transistors and the first amplifying dummy transistor may be connected to a common gate line and respectively connected to drains thereof. The plurality of first amplifying transistors may be activated in response to an activation state of the plurality of first switch transistors. The first amplifying dummy transistor may be activated in response to an activation state of the first switch dummy transistor. The second data amplifying circuit may include a plurality of second amplifying transistors and a second amplifying dummy transistor connected in parallel between the first power supply voltage and the plurality of fourth nodes. Gates of the plurality of second amplifying transistors and the second amplifying dummy transistor may be connected to the common gate line. The plurality of second amplifying transistors may be activated in response to an activation state of the plurality of second switch transistors, and the second amplifying dummy transistor may be activated in response to an activation state of the second switch dummy transistor.

According to at least some example embodiments, the input circuit may include a data input circuit and an inverted data input circuit. The data input circuit may include a plurality of first input transistors and a first input dummy transistor connected in parallel between the first node and the common node. Gates of the plurality of first input transistors may receive respective bits of the first input data. A gate of the first input dummy transistor may receive the input weight. The inverted data input circuit may include a plurality of second input transistors and a second input dummy transistor connected in parallel between the second node and the common node. Gates of the plurality of second input transistors may receive respective bits of the inverted first input data, and a gate of the second input dummy transistor may receive the inverted input weight.

At least one example embodiment provides a semiconductor device including a data generating circuit and a data bus inversion circuit. The data generating circuit may generate first input data and inverted first input data. The data bus inversion circuit may receive the first input data and the inverted first input data, and compare the number of bits of a first-type and the number of bits of a second-type in the first input data and inverted first input data. The data bus inversion circuit may exclude at least one bit from the first input data and the inverted data to determine a majority. The data bus inversion circuit may output a selecting signal and select either of the data and the inverted data to output low weight coding data.

At least one other example embodiment provides a semiconductor device including a data generating circuit, a majority voter circuit, an amplifying circuit and/or an encoder. The data generating circuit may be configured to generate data of a plurality of bits and inverted data of a plurality of bits. The majority voter circuit may include an input circuit connected between a first node and a common node, and a second node and the common node. The input circuit may be configured to receive an input weight, the input data, an inverted input weight having an opposite phase to the input weight and the inverted data. The input circuit may generate a voltage difference between the first node and the second node. The amplifying circuit may be connected between a first power supply and the first node, and may receive an amplification weight and the input data. The amplifying circuit may also be connected between the first power supply and the second node and may receive an inverted amplification weight having an opposite phase to the amplification weight and the inverted data. The amplifying circuit may also amplify the voltage difference between the first node and the second node. The majority voter circuit may compare the number of bits having a value of "0" and the number of bits having a value of "1" to determine a majority bit to generate a selecting signal. The encoder may receive the data and the inverted data and select either of the data and the inverted data to output the low weight coding data in response to the selecting signal.

According to at least one other example embodiment, semiconductor circuit may include a majority voter circuit. The majority voter circuit may be configured to generate a selecting signal based on first input data and inverted first input data. The first input data and the inverted first input data may each include an odd-number of bits, which may be comprised of a first type and bits of a second type. The generated selecting signal may be indicative of which of the first type and the second type of bits are in the majority.

A semiconductor device according to at least one example embodiment may include a data generating circuit and a data bus inversion circuit. The data generating circuit may be configured to generate input data and inverted input data. The data bus inversion circuit may include a semiconductor circuit. The semiconductor circuit may include a majority voter circuit. The majority voter circuit may be configured to generate a selecting signal based on first input data and inverted first input data. The first input data and the inverted first input data may each include an odd-number of bits, which may be comprised of a first type and bits of a second type. The generated selecting signal may be indicative of which of the first type and the second type of bits are in the majority. The majority voter circuit may be further configured to generate the first input data based on the input data and the inverted first input data based on the inverted input data.

According to at least some example embodiments, the semiconductor device may further include an encoder. The encoder may be configured to select one of the first input data and the inverted first input data to output as low weight coding data in response to the selecting signal.

A semiconductor circuit according to at least one other example embodiment may include a majority voter circuit. The majority voter circuit may be configured to generate a selecting signal based on first input data and inverted first input data. The first input data and the inverted first input data may each include an odd-number of bits, which may be comprised of a first type and bits of a second type. The generated selecting signal may be indicative of which of the first type and the second type of bits are in the majority. The majority voter circuit may be further configured to receive an input weight and an inverted input weight, and generate a voltage difference between the first node and the second node based on the first input data, the inverted first input data, the input weight and the inverted input weight.

BRIEF DESCRIPTION OF THE DRAWINGS

The present invention will be described in detail with respect to example embodiments shown in the drawings. In the drawings.

DETAILED DESCRIPTION OF EXAMPLE EMBODIMENTS

Figure 1:
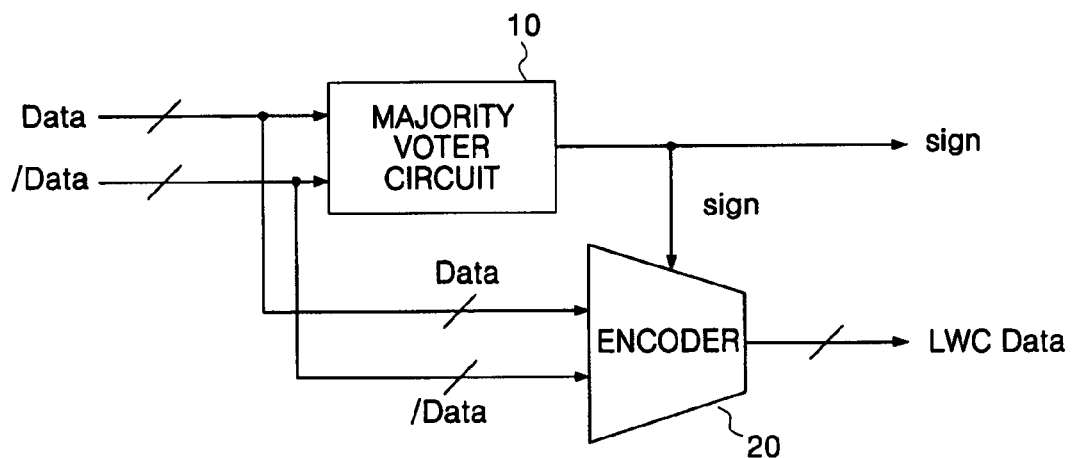
FIG. 1 is a block diagram illustrating a conventional data bus inversion circuit.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
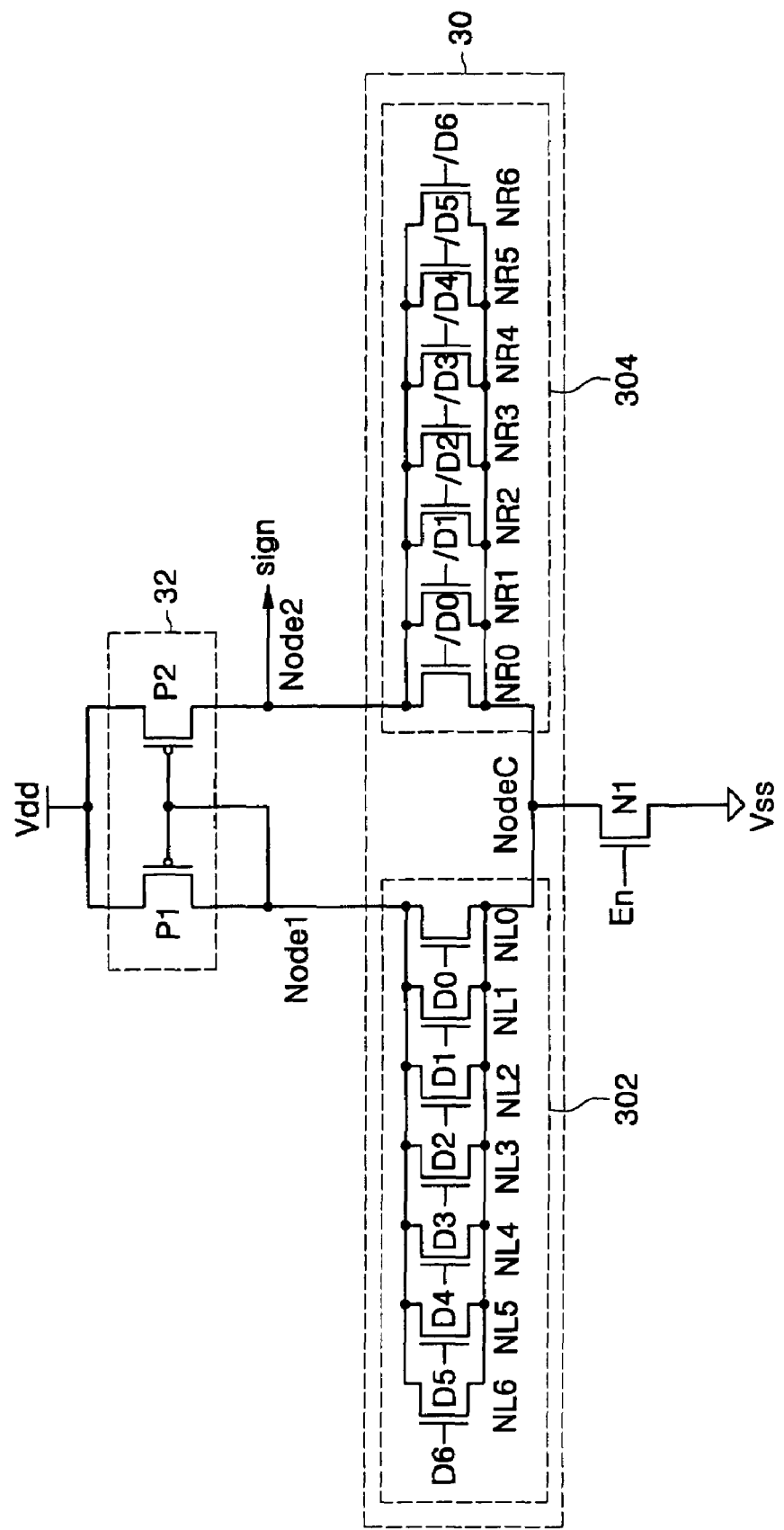
FIG. 3 is a circuit diagram illustrating a semiconductor circuit or majority voter circuit according to an example embodiment.

FIG. 3 is a circuit diagram illustrating a semiconductor circuit or majority voter circuit according to an example embodiment.

Referring to FIG. 3, the majority voter circuit may be an analog majority voter circuit including a differential amplifier. A first transistor N1 (e.g., an NMOS transistor) may be connected between a common node NodeC and ground voltage Vss. The transistor N1 may activate the differential amplifier in response to an enable signal En. The enable signal En may be applied together (e.g., concurrently or simultaneously) with data Data and/or inverted data /Data from the external circuit to activate the majority voter circuit. In another example, a power supply voltage may be applied to invariably activate the majority voter circuit.

An input circuit 30 of the majority voter circuit may include a data input circuit 302 and an inverted data input circuit 304. The data input circuit 302 may be connected between a first node Node1 and the common node NodeC. The data input circuit 302 may include a plurality of transistors NL0 to NL6 (which may be, e.g., NMOS transistors). The inverted data input circuit 304 may be connected between a second node Node2 and the common node NodeC, and may include a plurality of transistors NR0 to NR6 (which may be, e.g., NMOS transistors).

Figure 2:
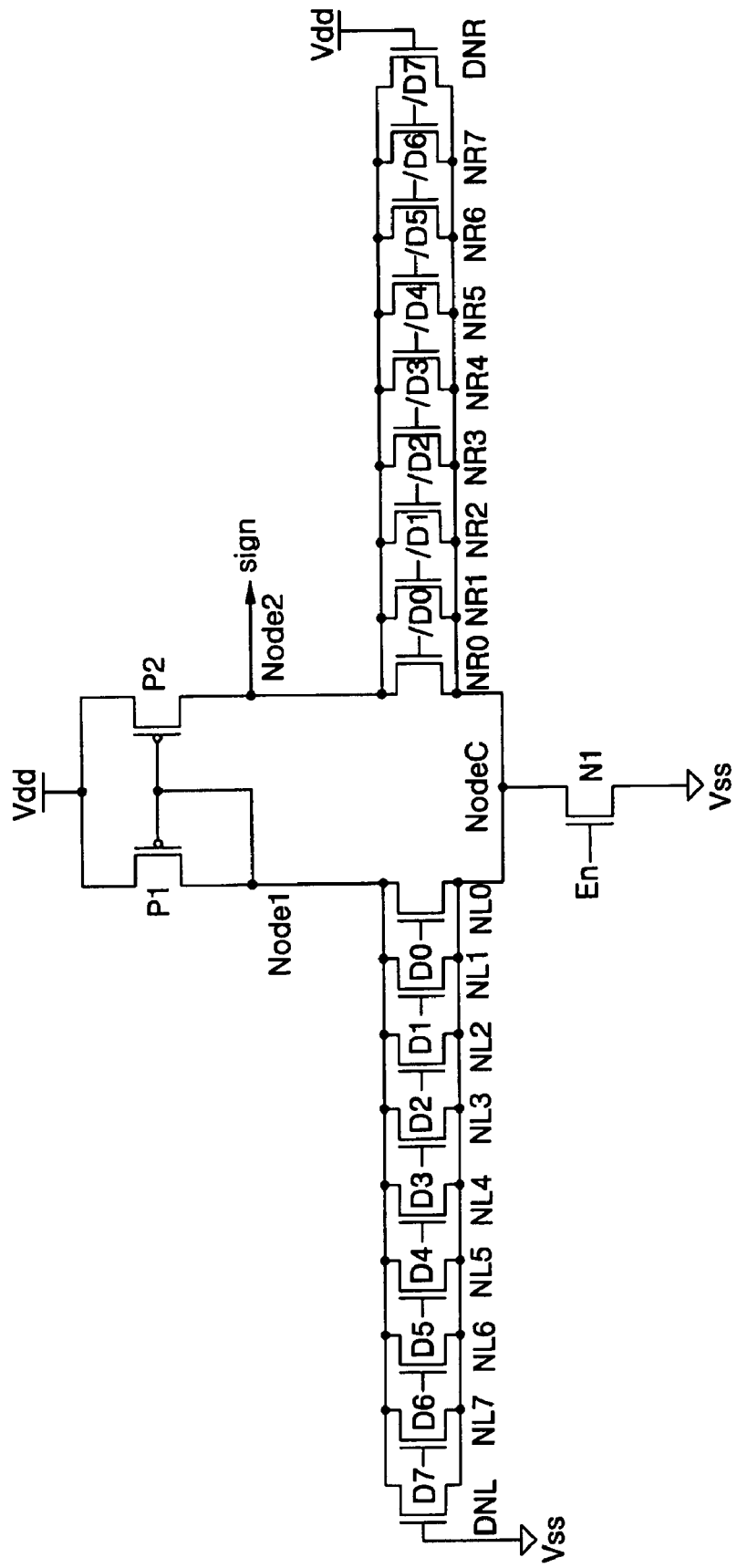
FIG. 2 is a circuit diagram illustrating a conventional majority voter circuit.

Unlike the conventional majority voter circuit FIG. 2, in the analog majority voter circuit of FIG. 3, 7 bits of the data D0 to D7 and seven bits of inverted data /D0 to /D7 may be input to the input circuit 30. In the example embodiment shown in FIG. 3, of the 8 data bits, the eighth bit is omitted. However, any other bit or combination of bits may be omitted as desired.

A voltage difference between the first node Node1 and the second node Node2 may be generated such that the plurality of transistors NL0 to NL6 of the data input circuit 302 may receive respective bits D0 to D6 of the data Data and the plurality of transistors NR0 to NR6 of the inverted data input circuit 304 may receive respective bits /D0 to /D6 of the inverted data /Data.

An amplifying circuit 32 of the majority voter circuit may include a transistor circuit including a transistor P1 and a transistor P2. The transistor P1 (which may be, e.g., a PMOS transistor) may be connected between a first power supply voltage Vdd and the first node Node1. The transistor P2 (which may be, e.g., a PMOS transistor) may be connected between the first power supply voltage Vdd and the second node Node2. Gates of the transistors P1 and P2 may be commonly connected to the first node Node1. The amplifying circuit 32 may detect and/or amplify the voltage difference between the first and second nodes Node1 and Node2 generated by the input circuit 30. A voltage level of the second node Node2 may be output as the selecting signal sign.

Unlike the conventional majority voter circuit of FIG. 2, the dummy transistors DNL and DNR may be omitted from majority voter circuits according to at least some example embodiments. The dummy transistors DNL and DNR of the conventional majority voter circuit may be arranged to apply a weight when the number of bits having a first logic value (e.g., a low logic level or "0") is equal to the number of bits having a second logic value (e.g., a high logic value or "1"). On the other hand, majority voter circuits according to example embodiments omit a part of data Data, and thus, may compare an odd-number of bits. As a result, within the majority voter circuit, the number of bits having a first logic value (e.g., a low logic value or "0") does not equal the number of bits having a second logic value (e.g., a high logic level or "1"). Therefore, dummy transistors DNL and DNR used in the conventional art majority voter circuit are not needed in majority voter circuits according to example embodiments.

For example purposes, an operation of the majority voter circuit of FIG. 3 will be explained with regard to a case in which the data bus inversion circuit performs low weight coding for data in which the number of bits having a logic value of "0" is in a majority. According to this example, the enable signal En may be applied to the transistor N1 to activate the majority voter circuit. When the data Data of "00100010" are input, the eighth bit may be omitted, and the remaining bits "0010001" may be applied to respective transistors NL0 to NL6 of the data input circuit 302. Similarly, 7 bits "1101110" of the inverted data /Data in which the eighth bit is omitted may be applied to respective transistors NR0 to NR6 of the inverted data input circuit 304.

In this example, two transistors NL2 and NL6 may be activated in the data input circuit 302, and five transistors NR0, NR1, and NR3 to NR5 may be activated in the inverted data input circuit 304. Thus, the voltage level of the second node Node2 may be lower than the voltage level of the first node Node1.

The transistors P1 and P2 of the amplifying circuit 32 may raise the voltage level of the first node Node1 and lower the voltage level of the second node Node2. As a result, the voltage level of the selecting signal sign may also be lowered and output at a low or "L" level, for example, a low logic level. As discussed herein the selecting signal sign may be output at a voltage level corresponding to one of a high logic level or a low logic level. For the sake of clarity, these values will be discussed as a high low logic level and a low logic level.

On the other hand, when the data Data of "11101111" are input, the eighth bit is omitted, and the remaining bits "1110111" may be applied to the transistors NL0 to NL6 of the data input circuit 302, respectively. Similarly, 7 bits "0001000" of the inverted data /Data in which the eighth bit is omitted may be applied to the transistors NR0 to NR6 of the inverted data input circuit 304, respectively. As a result, six transistors NL0 to NL2 and NL4 to NL6 may be activated in the data input circuit 302, and one transistor NR3 may be activated in the inverted data input circuit 304, so that the voltage level of the second node Node2 becomes higher than the voltage level of the first node Node1.

The transistors P1 and P2 of the amplifying circuit 32 may lower the voltage level of the first node Node1 and raise the voltage level of the second node Node2, in response to a voltage of the first node Node1 that is lower than the voltage of the second node Node2. As a result, the voltage level of the selecting signal sign may be raised and output at a higher of "H" level.

When data is equal in the number of bits having a value of "0" and the number of bits having a value of "1" and the last bit has a value of "0" (e.g., "11100010"), the last bit may be omitted and data "1110001" may be applied to the data input circuit 302 of the majority voter circuit, and data "0001110" may be applied to the inverted data input circuit 304. In this example, the same determination as where the number of bits having a value of "1" is in a majority is made, so that the voltage level of the selecting signal sign is representative of a high logic level.

When data is equal in the number of bits having a value of "0" and the number of bits having a value of "1" and the last bit has a value of "1" (e.g., "01010101") the last bit may be omitted, and "0101010" may be applied to the data input circuit 302 of the majority voter circuit. In this example, data "1010101" may be applied to the inverted data input circuit 304. In this example, the same determination as where the number of bits having a value of "0" is in a majority is made, so that the voltage level of the selecting signal sign is representative of a low logic level.

TABLE 1

| Number of "1"s | Number of "0"s | Ratio | Last bit | Number of "1"s:Number of "0"s | Selecting signal |
|---|---|---|---|---|---|
| 3 | 4 | 14.3% | 0 | 3:5 | L |
|  |  |  | 1 | 4:4 | L |

TABLE 1-continued

| Number of "1"s | Number of "0"s | Ratio | Last bit | Number of "1"s:Number of "0"s | Selecting signal |
|---|---|---|---|---|---|
| 4 | 3 | 14.3% | 0 | 4:4 | H |
|  |  |  | 1 | 5:3 | H |

Table 1 shows an example operation for comparing 7 bits to determine a majority by according to the majority voter circuit of FIG. 3. Because an odd number of bits are compared, the number of bits having a value of "0" may not be equal to the number of bits having a value of "1". In the conventional majority voter circuit discussed above with regard to FIG. 2 the ratio difference between the ends of the input circuit is about 11.1% or ⅑ when a weight of "1" is applied. But in majority voter circuit according to at least this example embodiment, the ratio difference between the ends of the input circuit is about 14.3% or ⅐ when the 7 bits are compared. Because the ratio difference between the ends of the input circuit is greater within majority voter circuits according to example embodiments, abnormal operation and/or malfunction resulting from data distortion caused by noise and/or the impedance mismatching with an external device may be reduced.

As shown in Table 1, when the ratio between the number of bits having a value of "0" and the number of bits having a value of "1" is about 3:4 or about 4:3, the value of the last bit does not affect the selecting signal sign. For example, assuming the number of bits having a value of "0" is 4 and the number of bits having a value of "1" is 3. If the last bit is "0" the ratio between the number of bits having a value of "0" and the number of bits having a value of "1" is 5:3, so that the selecting signal is output with a lower or "L" level. On the other hand, if the last bit is "1" the ratio between the number of bits having a value of "0" and the number of bits having a value of "1" is 4:4. In this example, whether the LWC data obtained by performing the low weight coding is output "as is" or as inverted data may not matter because both cases use the same bandwidth. Accordingly, the selecting signal is output with a lower or low logic level or "as is".

In another example, assuming the number of bits having a value of "0" is 3 and the number of bits having a value of "1" is 4. If the last bit is "1" the ratio between the number of bits having a value of "0" and the number of bits having a value of "1" is 3:5, and the selecting signal sign may be output with a high logic level. If the last bit is "0", the ratio between the number of bits having a value of "0" and the number of bits having a value of "1" is 4:4. In this case, the selecting signal sign may be output at the high logic level or "as is."

The above-described example embodiment has been explained with regard to a majority voter circuit in which one bit is omitted and the remaining bits are used to determine a majority. However, majority voter circuits according to example embodiments may be designed to omit one or more bits such that the number of the remaining bits is odd. The majority voter circuit described above may employ a current mirror differential amplifier or any other suitable amplifier.

Majority voter circuits according to at least some example embodiments may omit a given number of bits from the data Data and compare the remaining bits to determine a majority.

Figure 4:
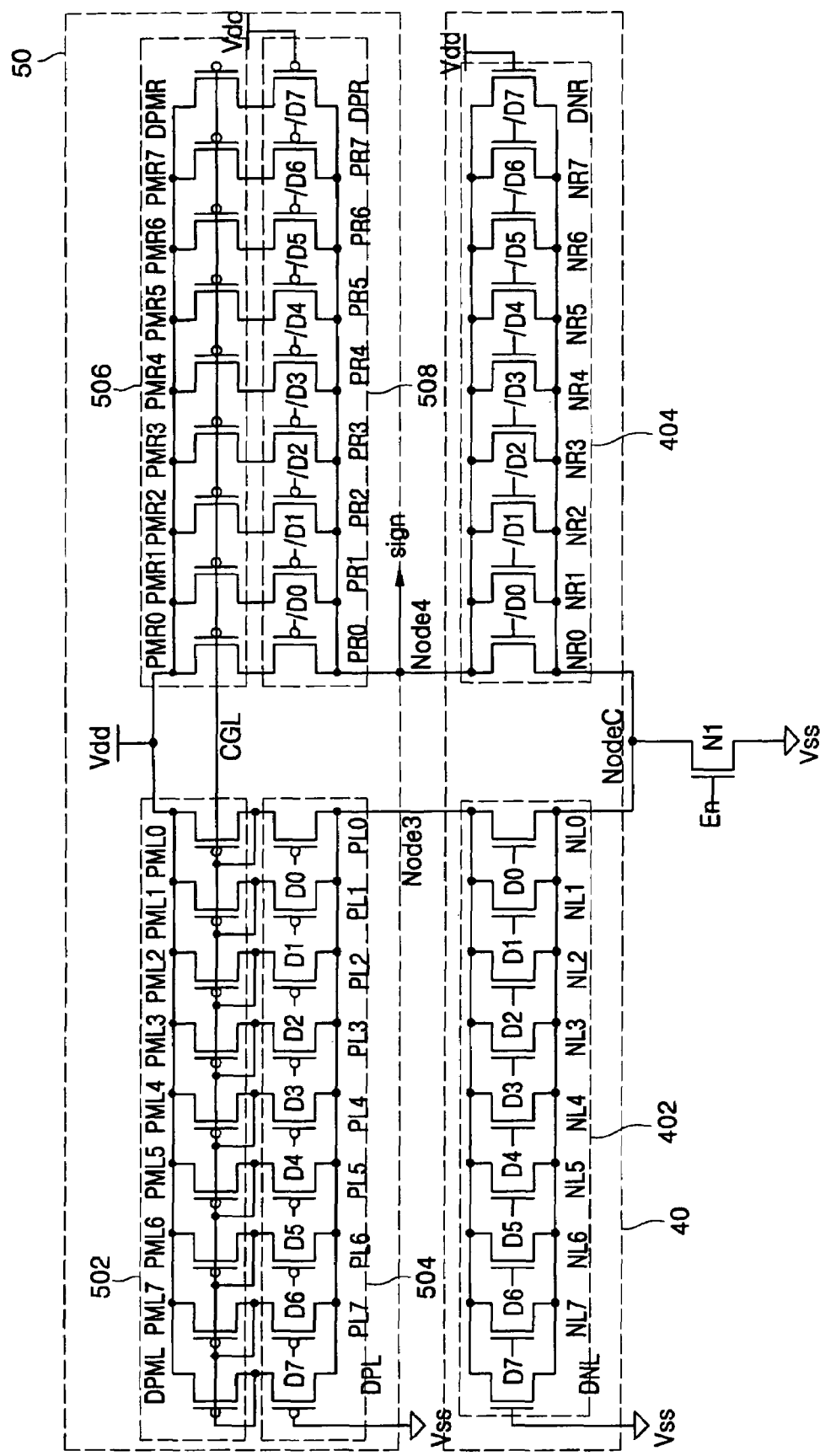
FIG. 4 is a circuit diagram illustrating a semiconductor circuit or majority voter circuit according to another example embodiment.

FIG. 4 is a circuit diagram illustrating a semiconductor circuit or majority voter circuit according to another example embodiment.

The majority voter circuit of FIG. 3 may output a selecting signal sign having a high logic level or low logic level even when the number of bits having a value of "1" and the number of bits having a value of "0" are the same (e.g., 4:4) as shown in Table 1. However, a semiconductor device may use a selecting signal designated as one of the two levels when the number of bits having a value of "1" and the number of bits having a value of "0" are the same. Because the selecting signal sign may be output as a signal, it may be more reasonable to perform low weight decoding in consideration of the selecting signal.

Referring to FIG. 4, a transistor N1 (e.g., an NMOS transistor) connected between a common node NodeC and a ground voltage Vss may be used to activate a differential amplifier in response to an enable signal En.

The majority voter circuit of FIG. 4 may include an input circuit 40. The input circuit 40 may include a data input circuit 402 connected between a third node Node3 and the common node NodeC. The data input circuit 402 may include a plurality of transistors NL0 to NL7 (which may be, e.g., NMOS transistors) and at least one dummy transistor DNL. The input circuit 40 may further include an inverted data input circuit 404, which may be connected between a fourth node Node4 and the common node NodeC. The inverted data input circuit 404 may include a plurality of transistors NR0 to NR7 (which may be, e.g., NMOS transistors) and at least one dummy transistor DNR.

The plurality of transistors NL0 to NL7 of the data input circuit 402 may receive bits D0 to D7 of data Data, respectively. The plurality of transistors NR0 to NR7 of the inverted data input circuit 404 may receive bits /D0 to /D7 of inverted data /Data, respectively. The input circuit 40 may generate a voltage difference between the third node Node3 and the fourth node Node4 based on the received data Data and the inverted data /Data. The dummy transistor DNL may receive a second voltage Vss through a gate, and the dummy transistor DNR may receive a first voltage Vdd through a gate.

An amplifying circuit 50 may include first, second, third and fourth amplifying circuits 502, 504, 506 and 508. The first amplifying circuit 502 may include a plurality of amplifying transistors PML0 to PML7 (e.g., PMOS transistors), at least one amplifying dummy transistor DPML connected to the first power supply voltage Vdd. The second amplifying circuit 504 may include a plurality of switch transistors PL0 to PL7 (e.g., PMOS transistors) and a switch dummy transistor DPL. The second amplifying circuit 504 may be connected between the third node Node3 and the first amplifying circuit 502. The switch dummy transistor DPL may be connected between the third node Node3 and the amplifying dummy transistor DPML.

The third amplifying circuit 506 may include a plurality of amplifying transistors PMR0 to PMR7 (e.g., PMOS transistors) and an amplifying dummy transistor DPMR which may be connected to the first voltage Vdd. The fourth amplifying circuit 508 may include a plurality of switch transistors PR0 to PR7 (which may be, e.g., PMOS transistors) and a switch dummy transistor DPR. The fourth amplifying circuit 508 may be connected between the fourth node Node4 and the third amplifying circuit 506. The switch dummy transistor DPR may be connected between the fourth node Node4 and the amplifying dummy transistor DPMR.

The plurality of transistors NL0 to NL7 of the data input circuit 402 may be the same or substantially the same as the plurality of transistors NR0 to NR7 of the inverted data input circuit 404, and the dummy transistor DNL may be the same or substantially the same as the dummy transistor DNR.

For example, if a weight of "1" is to be applied, the plurality of transistors NL0 to NL7 and NR0 to NR7 may be the same or substantially the same as the dummy transistors DNL and DNR. The plurality of amplifying transistors PML0 to PML7 may be the same or substantially the same as the plurality of amplifying transistors PMR0 to PMR7, and the plurality of switch transistors PL0 to PL7 may be the same or substantially the same as the plurality of switch transistors PR0 to PR7. The amplifying dummy transistor DRML may be the same or substantially the same as the amplifying dummy transistor DPMR, and the switch dummy transistor DPL may be the same or substantially the same as the switch dummy transistor DPR.

When a weight of "1" is applied, the plurality of transistors PML0 to PML7 and PMR0 to PMR7 may be the same or substantially the same as the amplifying dummy transistors DPML and DPMR, and a plurality of switch transistors PL0 to PL7 and PR0 to PR7 may be the same or substantially the same as the switch dummy transistors DPL and DPR.

Gates of the plurality of amplifying transistors PML0 to PML7, the amplifying dummy transistor DPML, the plurality of amplifying transistors PMR0 to PMR7, and the amplifying dummy transistor DPMR may be connected to a common gate line CGL. Gates of the plurality of amplifying transistors PML0 to PML7 and the amplifying dummy transistor DPML may be connected to their drains, respectively. The plurality of switch transistors PL0 to PL7 may receive bits D0 to D7 of data Data, respectively, and the plurality of switch transistors PR0 to PR7 may receive bits /D0 to /D7 of inverted data /Data, respectively. The switch dummy transistor DPR may receive the first voltage Vdd through its gate, and the switch dummy transistor DPL may receive the second voltage Vss through its gate.

The amplifying circuit of the conventional majority voter circuit in FIG. 2 only detects and amplifies a voltage difference between the first node Node1 and the second node Node2 within the input circuit. However, in the amplifying circuit of FIG. 4, the plurality of switch transistors PL0 to PL7 and PR0 to PR7 may receive data D0 to D7 and inverted data /D0 to /D7 to activate or de-activate the plurality of amplifying PMOS transistors PML0 to PML7 and PMR0 to PMR7. Because the amplifying dummy transistors DPML and DPMR and the switch dummy transistors DPL and DPR are provided, a weight may be applied together with the dummy transistors DNL and DNR of the input circuit when the number of bits having a value of "0" and the number of bits having a value of "1" are the same.

When low weight coding is set such that bits having a value of "0" are in a majority in the semiconductor device, the majority voter circuit of FIG. 4 may operate as follows. An enable signal En may be applied to the transistor N1 to activate the majority voter circuit. If data D0 to D7 are input as "00100010", for example, two transistors NL2 and NL6 may be activated in the data input circuit 402, and six transistors NR0, NR1, NR3 to NR5, and NR7 may be activated in the inverted data input circuit 404. The dummy transistor DNR may be (e.g., always or constantly) in an active state because its gate is electrically connected to the first voltage Vdd, and the dummy transistor DNL may be inactive (e.g., always or constantly) because its gate is electrically connected to the second voltage Vss.

Thus, two transistors NL2 and NL6 may be activated in the data input circuit 402, and seven NMOS transistors NR0, NR1, NR3 to NR5, NR7, and DNR may be activated in the inverted data input circuit 404, so that a voltage level of the fourth node Node4 is lower than a voltage level of the third node Node3.

The plurality of switch transistors PL0 to PL7 may receive data D0 to D7 activating switch transistors PL0, PL1, PL3 to PL5 and PL7, and the switch dummy transistor DPL may be in an active state because its gate is electrically connected to the second voltage Vss. The amplifying transistors PML0 to PML7 and the amplifying dummy transistor DPML connected to the common gate line CGL may be activated in response to the activated six switch transistors PL0, PL1, PL3 to PL5 and PL7 and the activated switch dummy transistor DPL. However, in response to the six active switch transistors PL0, PL1, PL3 to PL5, and PL7, the six amplifying transistors PML0, PML1, PML3 to PML5 and PML7 and the amplifying dummy transistor DPML may be activated.

The plurality of switch transistors PR0 to PR7 may receive the inverted data /D0 to /D7 to activate switch transistors PR2 and PR6, and because the gates of the amplifying transistors PMR0 to PMR7 are connected to the common gate line CGL, the amplifying transistors PMR0 to PMR7 may be activated in response to the six active switch transistors PL0, PL1, PL3 to PL5, and PL7 and the activated switch dummy transistor DPL. However, in response to the two active switch transistors PR2 and PR6, the two amplifying transistors PMR2 and PMR6 may be activated. The switch dummy transistor DPR may be de-activated because its gate is connected to the first voltage Vdd. The amplifying dummy transistor DPMR may also be de-activated.

In one example, the amplifying circuit 50 may have a current mirror circuit configuration. In this example, if the voltage of the third node Node3 is greater than the voltage of the fourth node Node4, the amplifying circuit 50 may raise the voltage level of the third node Node3 and decrease a voltage level of the fourth node Node4 based on the voltage of the third node Node3. The current mirror circuit of the amplifying circuit may change an electric current flowing to the third and fourth nodes Node3 and Node4 proportion to the number of the amplifying transistors PML0, PML1, PML3 to PML5, PML7, PMR2, and PMR6 and the amplifying dummy transistor DPML that are active. Thus, the fourth node Node4 may have a voltage that is reduced by about $2/7$. A voltage ratio between the third node Node3 and the fourth node Node4 may be about $7:2*2/7$ or 49:4. As a result, a voltage difference between the ends of the amplifying circuit 50 may be about 84.9% ($45/53$), and a voltage level of the selecting signal sign may be decreased and output at a low logic level.

On the other hand, if data D0 to D7 are input as "11101111", transistors NL0 to NL2 and NL4 to NL7 may be activated in the data input circuit 402, and transistor NR3 may be activated in the inverted data input circuit 404. Thus, transistors NL0 to NL2 and NL4 to NL7 may be activated in the data input circuit 402, and transistors NR3 and DNR may be activated in the inverted data input circuit 404, so that a voltage level of the fourth node Node4 may be higher than a voltage level of the third node Node3.

In one end of the amplifying circuit 50, a plurality of switch transistors PL0 to PL7 may receive data D0 to D7, so that one switch transistor PL3 may be activated. In addition, the switch dummy transistor DPL may constantly be in an activated state because its gate is electrically connected to the second power Vss. The amplifying transistors PML0 to PML7 connected to the common gate line CGL may be activated in response to the activated switch transistor PL3 and the activated switch dummy transistor DPL. However, in response to the activated switch transistor PL3 and the activated switch dummy transistor DPL, the amplifying transistor PML3 and the amplifying dummy transistor DPML may be activated.

A plurality of switch transistors PR0 to PR7 may receive the inverted data /D0 to /D7, so that transistors PR0 to PR2 and PR4 to PR7 may be activated, and because the gates of the amplifying transistors PMR0 to PMR7 may be connected to the common gate line CGL, the amplifying transistors PMR0 to PMR7 may be activated in response to the activated switch transistor PL3 and the activated switch dummy transistor DPL. In response to the activated switch transistors PR0 to PR2 and PR4 to PR7, the amplifying transistors PMR0 to PMR2 and PMR4 to PMR7 may be activated. The switch dummy transistor DPR may be in an inactive state because its gate is connected to the first power Vdd, and so the amplifying dummy transistor DPMR may be deactivated.

The amplifying circuit 50 may reduce a voltage level of the third node Node3 and raise a voltage level of the fourth node Node4 in response to a voltage of the third node Node3, which is lower than the fourth node Node4. The current mirror circuit of the amplifying circuit may change an electric current flowing to the third and fourth nodes Node3 and Node4 in proportion to the number of the amplifying transistors PML3, PMR0 to PMR2 and PMR4 to PMR7 and the amplifying dummy transistor DPML which are active. Thus, the amplifying circuit 50 may cause the fourth node Node4 to have a voltage which is increased by about $7/2$. A voltage ratio between the third node Node3 and the fourth node Node4 may be about $2:7*7/2$ or 4:49. As a result, a voltage level of the selecting signal sign is increased and output at a high logic level, and a voltage difference between the ends is about 84.9% ($45/53$).

Still referring to FIG. 4, if the number of bits having a value of "0" is the same as the number of bits having a value of "1" (e.g., data Data of "11100010", four transistors NL0 to NL2 and NL6 may be activated in the data input circuit 402, and four transistors NR3 to NR5 and NR7 may be activated in the inverted data input circuit 404. Because four transistors NL0 to NL2 and NL6 are active in the data input circuit 402 and five transistors NR3 to NR5, NR7, and DNR are active in the inverted data input circuit 404, a voltage level of the fourth node Node4 may become lower than a voltage level of the third node Node3.

At one end of the amplifying circuit 50, a plurality of switch transistors PL0 to PL7 may receive data D0 to D7, respectively, so that four switch transistors PL3 to PL5 and PL7 may be activated, and the switch dummy transistor DPL may constantly be in an active state because its gate is electrically connected to the second power Vss. The amplifying transistors PML0 to PML7 connected to the common gate line CGL may be activated in response to the four active switch transistors PL3 to PL5 and PL7 and the active switch dummy transistor DPL. In response to the active switch transistors PL3 to PL5 and PL7 and the active switch dummy transistor DPL, the four amplifying transistors PML3 to PML5 and PML7 and the amplifying dummy transistor DPML may be activated.

At the other end of the amplifying circuit, a plurality of switch transistors PR0 to PR7 may receive the inverted data /D0 to /D7, respectively, and four switch transistors PR0 to PR2 and PR6 may be activated. Because the gates of the amplifying transistors PMR0 to PMR7 are connected to the common gate line CGL, the transistors PMR0 to PMR7 may be activated in response to the activated four switch transistors PL3 to PL5 and PL7 and the activated switch dummy transistor DPL. In response to the four active switch transistors PR0 to PR2 and PR6, the four amplifying transistors PMR0 to PMR2 and PMR6 may be activated. The switch dummy transistor DPR may be in a deactivated state because its gate is connected to the first power Vdd. As a result, the amplifying dummy transistor DPMR may be deactivated.

The amplifying circuit may raise a voltage level of the third node Node3 and reduce a voltage level of the fourth node Node4 in response to a voltage of the third node Node3, which may be higher than the fourth node Node4. In this example, the current mirror circuit of the amplifying circuit may change an electric current flowing to the third and fourth nodes Node3 and Node4 in proportion to the number of amplifying transistors PML3 to PML5, PML7, PMR0 to PMR2, and PMR6 and the amplifying dummy transistor DPML which are active. Thus, the amplifying circuit may reduce the voltage of the fourth node Node4 to about 4/5. A voltage ratio between the third node Node3 and the fourth node Node4 may be about 5:4*4/5 or 25:16. As a result, a voltage level of the selecting signal sign may be reduced and output with a low logic level, and a voltage difference between the ends may be about 21.9% (9/41).

TABLE 2

| number of 1s | number of 0s | Voltage ratio difference of both ends according to FIG. 2 | Voltage ratio difference of both ends according to FIG. 4 |
|---|---|---|---|
| 3 | 5 | 33.3% (6:3) | 60% (36:9) |
| 4 | 4 | 11.1% (5:4) | 21.9% (25:16) |
| 5 | 3 | 11.1% (4:5) | 21.9% (16:25) |
| 6 | 2 | 33.3% (3:6) | 60% (9:36) |

Table 2 shows an example, partial operation for determining a majority using the conventional majority voter circuit of FIG. 2 and the majority voter circuit according to an example embodiment as shown in FIG. 4. In the conventional majority voter circuit of FIG. 2, even though a weight of "1" is applied to the dummy transistor DNR, if a ratio of the number of bits having a value of "1" to the number of bits having a value of "0" is 4:4 or 5:3, a voltage ratio difference between of the ends may be about 11.1%. However, in the majority voter circuit of FIG. 4, if a weight of "1" is applied to the dummy transistors DNR and DPML, even though a ratio of the number of bits having a value of "1" to the number of bits having a value of "0" is 4:4 or 5:3, a voltage ratio difference between the ends may be about 21.9%, which is about twice the voltage ratio difference in the conventional majority voter circuit of FIG. 2. Thus, the majority voter circuit according to at least some example embodiments may be more robust, which may reduce data distortion resulting from noise and/or malfunction resulting from the impedance mismatching.

Figure 5:
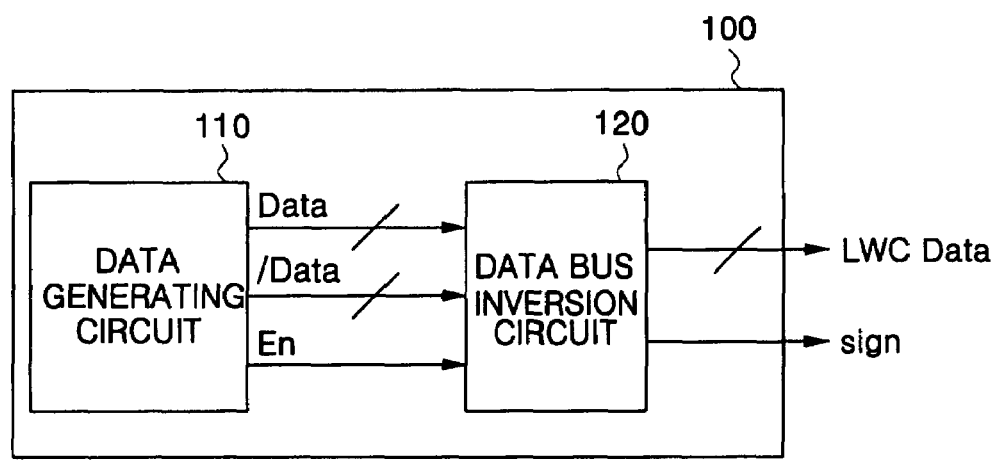
FIG. 5 is a block diagram illustrating a semiconductor device according to an example embodiment.

FIG. 5 is a block diagram illustrating a semiconductor device according to an example embodiment. The semiconductor device of FIG. 5 may include the majority voter circuit of FIG. 3 or 4.

Referring to FIG. 5, a data generating circuit 110 may output the data Data and the inverted data /Data. The data generating circuit 110 may output the enable signal En if the majority voter circuit of the data bus inversion circuit 120 is not always active.

The data bus inversion circuit 120 may receive the data Data and the inverted data /Data from the data generating circuit 110, and determine which bit-type is in a majority. For example, the data bus inversion circuit 120 may determine which of a bit having a value of "0" and a bit having a value of "1" is in a majority. Based on which bit-type is in the majority, the data bus inversion circuit 120 may select one of the data Data and the inverted data /Data and output low weight coding (LWC) data together with the selecting signal sign. As described above, the LWC data which is low weight coded may increase the bandwidth of the data I/O line while reducing data skew. In the LWC data, either bits having a value of "0" or bits having a value of "1" may be a majority.

As noted above, the data bus inversion circuit 120 may include the majority voter circuit of FIG. 3 or 4 for performing the above-described operations and/or functions.

Although not shown, the semiconductor device may include a data output circuit such as an off chip driver (OCD) to perform an impedance matching operation to reduce signal distortion when the selecting signal sign and the LWC data may be output to the external circuit.

As described above, the majority voter circuits and semiconductor devices according to example embodiments may omit a given or desired number bit(s) from the data and compare the remaining odd-number bits to determine which bit or bit-type is in a majority. Also, the amplifying circuit of majority voter circuits may be configured to receive the input data and the inverted input data. As a result, even when the number of bits having a value of "0" and the number of bits having a value of "1" are the same, a more robust circuit in which data distortion (e.g., caused from noise and/or abnormal operation resulting from the impedance mismatching) is reduced may be produced. Further, the number of bits of data compared may be reduced, the majority determining speed may increase and/or the number of transistors may be reduced, whereby the layout area size may be reduced and/or power consumption may be reduced.

What is claimed is:

1. A semiconductor circuit comprising:
a majority voter circuit configured to generate a selecting signal being indicative of which of a first type and a second type of bits in input data are in a majority, wherein the majority voter circuit includes,
an input circuit connected between a first node, a second node and a common node, the input circuit being configured to generate a voltage difference between the first node and the second node based on the input data, and inverted input data,
an input weight and an inverted input weight,
a switching circuit comprising a first switch that includes a plurality of first switch transistors and a first dummy transistor connected in parallel between the first node and a third node, a second switch connected between the second node and a fourth node, and the switching circuit being configured to receive an amplification weight, the input data, an inverted amplification weight and the inverted input data, and
a data amplifying circuit configured to amplify a voltage of the first node in proportion to the received amplification weight and a number of bits of the first type in the input data, and a voltage of the second node in proportion to the inverted amplification weight and a number of bits of the first type in the inverted input data,
wherein the data amplifying circuit comprises,
a first data amplifier including a plurality of first amplifying transistors and a first amplifying dummy transistor connected in parallel between a first power supply voltage and the third node, gates of the plurality of first amplifying transistors and the first amplifying dummy transistor being connected to a common gate line and connected to a corresponding drain of one of the plurality of first amplifying transistors and the first amplifying dummy transistor, the plurality of first amplifying transistors being activated in response to an activation state of the plurality of first switch transistors, the first amplifying dummy transistor being turned on in response to an activation state of the first dummy transistor.

2. The semiconductor circuit of claim 1, wherein the first type of bit is a bit having a value of '0', and the second type of bit is a bit having a value of '1'.

3. The semiconductor circuit of claim 1, wherein the data input circuit includes,
a plurality of first NMOS transistors each receiving a corresponding bit of the input data.

4. The semiconductor circuit of claim 1, wherein the inverted data input circuit includes,
a plurality of second NMOS transistors each receiving a corresponding bit of the inverted input data.

5. The semiconductor circuit of claim 1, further including,
an active circuit connected between the common node and a second power supply voltage source, the active circuit being configured to activate the majority voter circuit in response to an enable signal.

6. The semiconductor circuit of claim 5, wherein the active circuit is a transistor or transistor circuit.

7. The semiconductor circuit of claim 6, wherein the active circuit is an NMOS transistor.

8. The semiconductor circuit of claim 7, wherein the enable signal is applied from an external source.

9. The semiconductor circuit of claim 1, wherein the switching circuit further includes,
the second switch includes a plurality of second switch transistors and a second dummy transistor connected in parallel between the second node and the fourth node, gates of the plurality of second switch transistors being configured to receive respective bits of the inverted input data, and a gate of the second dummy transistor being configured to receive the inverted amplification weight,
wherein gates of the plurality of first switch transistors are configured to receive respective bits of the input data, and a gate of the first dummy transistor is configured to receive the amplification weight.

10. The semiconductor circuit of claim 9, wherein the first and second switch transistors and the first and second dummy transistors are PMOS transistors.

11. The semiconductor circuit of claim 1, wherein the amplification weight and the inverted amplification weight are a second power supply voltage and the first power supply voltage, respectively.

12. The semiconductor circuit of claim 1, wherein the data amplifying circuit further comprises,
a second data amplifier having a plurality of second amplifying transistors and a second amplifying dummy transistor connected in parallel between the first power supply voltage and the fourth node, gates of the plurality of second amplifying transistors and the second amplifying dummy transistor being connected to the common gate line, the plurality of second amplifying transistors being activated in response to an activation state of the plurality of second switch transistors, the second amplifying dummy transistor being turned on in response to an activation state of the second dummy transistor.

13. The semiconductor circuit of claim 12, wherein the first and second amplifying transistors and the first and second amplifying dummy transistors are PMOS transistors.

14. The semiconductor circuit of claim 1, wherein the input circuit includes,
a data input circuit configured to receive the input data, a gate of the first input dummy transistor being configured to receive the input weight, and
an inverted data input circuit configured to receive the inverted input data and the inverted input weight.

15. The semiconductor circuit of claim 14, wherein the data input circuit includes a plurality of first input transistors and a first input dummy transistor connected in parallel between the first node and the common node, gates of the plurality of first input transistors being configured to receive respective bits of the input data, and a gate of the first input dummy transistor being configured to receive the input weight, and wherein
the inverted data input circuit includes a plurality of second input transistors and a second input dummy transistor connected in parallel between the second node and the common node, gates of the plurality of second input transistors being configured to receive respective bits of the inverted input data, a gate of the second input dummy transistor being configured to receive the inverted input weight.

16. The semiconductor circuit of claim 14, wherein the input weight and the inverted input weight are a second power supply voltage and the first power supply voltage, respectively.

17. A semiconductor device, comprising:
a data generating circuit configured to generate input data and inverted input data; and
a data bus inversion circuit including the semiconductor circuit of claim 1.

18. The semiconductor device of claim 17, wherein the data bus inversion circuit further includes,
an encoder configured to select one of the input data and the inverted input data to output low weight coding data in response to the selecting signal.

19. The semiconductor device of claim 17, wherein the switching circuit further includes,
the second switch includes a plurality of second switch transistors and a second dummy transistor connected in parallel between the second node and the fourth node, gates of the plurality of second switch transistors being configured to receive respective bits of the inverted input data, and a gate of the second dummy transistor being configured to receive the inverted amplification weight,
wherein gates of the plurality of first switch transistors are configured to receive respective bits of the input data, and a gate of the first dummy transistor is configured to receive the amplification weight.

20. The semiconductor device of claim 17, wherein the data amplifying circuit includes,
a second data amplifier having a plurality of second amplifying transistors and a second amplifying dummy transistor connected in parallel between the first power supply voltage and the fourth node, gates of the plurality of second amplifying transistors and the second amplifying dummy transistor being connected to the common gate line, the plurality of second amplifying transistors being activated in response to an activation state of the plurality of second switch transistors, the second amplifying dummy transistor being turned on in response to an activation state of the second dummy transistor.

21. The semiconductor device of claim 17, wherein the input circuit includes,
a data input circuit configured to receive the input data, a gate of the first input dummy transistor being configured to receive the input weight, and
an inverted data input circuit configured to receive the inverted input data and the inverted input weight.

22. The semiconductor device of claim 21, wherein the data input circuit includes a plurality of first input transistors and a first input dummy transistor connected in parallel between the first node and the common node, gates of the plurality of first input transistors being configured to receive respective bits of the input data, and a gate of the first input dummy transistor being configured to receive the input weight, and wherein the inverted data input circuit includes a plurality of second input transistors and a second input dummy transistor connected in parallel between the second node and the common node, gates of the plurality of second input transistors being configured to receive respective bits of the inverted input data, a gate of the second input dummy transistor being configured to receive the inverted input weight.

23. The semiconductor device of claim 17 wherein the data bus inversion circuit is configured to output the selecting signal and low weight coding data.

* * * * *